(12) United States Patent
Gruber

(10) Patent No.: US 9,411,911 B2
(45) Date of Patent: Aug. 9, 2016

(54) PROCESS CONTROL SYSTEM FOR PRODUCTION OF PARTS WITH GRAPHICAL INTERFACE

(75) Inventor: Juan Gruber, Kreuzlingen (CH)

(73) Assignee: KISTLER HOLDING AG, Winterthur (CH)

( * ) Notice: Subject to any disclaimer, the term of this patent is extended or adjusted under 35 U.S.C. 154(b) by 457 days.

(21) Appl. No.: 13/810,970

(22) PCT Filed: Jul. 14, 2011

(86) PCT No.: PCT/CH2011/000164
§ 371 (c)(1),
(2), (4) Date: Jan. 18, 2013

(87) PCT Pub. No.: WO2012/009821
PCT Pub. Date: Jan. 26, 2012

(65) Prior Publication Data
US 2013/0123967 A1    May 16, 2013

(30) Foreign Application Priority Data

Jul. 21, 2010  (CH) .................................. 1201/10

(51) Int. Cl.
*G06F 17/50* (2006.01)
*G05B 19/4065* (2006.01)
(Continued)

(52) U.S. Cl.
CPC ............ *G06F 17/50* (2013.01); *G05B 19/4065* (2013.01); *G05B 19/41875* (2013.01); *G05B 23/0216* (2013.01); *G05B 23/0235* (2013.01); *G05B 2219/23165* (2013.01);
(Continued)

(58) Field of Classification Search
None
See application file for complete search history.

(56) References Cited

U.S. PATENT DOCUMENTS 5,470,218 A * 11/1995 Hillman ................ B29C 45/768
264/40.6
5,887,337 A * 3/1999 Prochaska ......... B29C 45/14065
29/605

(Continued)

FOREIGN PATENT DOCUMENTS

| EP | 1342534 | 9/2003 |
|---|---|---|
| WO | WO 01/98846 | 12/2001 |

(Continued)

OTHER PUBLICATIONS

English translation of International Preliminary Report on Patentability, dated Jan. 22, 2013.

(Continued)

*Primary Examiner* — Mohammad Ali
*Assistant Examiner* — Bernard G Lindsay
(74) *Attorney, Agent, or Firm* — Dority & Manning, P.A.

(57) ABSTRACT

A device for controlling the course of a process in the production of parts in a tool with or without subsequent reject separation, includes a sensor, which is fitted to the tool to detect measured values during a production process, which can mean an assembly process, a jointing process and any other process, until the part to be produced is finished and ready for delivery. The device includes an output element and a data processing system having a display for reading in and displaying the detected measured values. The data processing system analyzes target parameters provided by the user and the detected measured values to determine an output quantity that is transferred by the output element for the purpose of controlling the course of the process. Operation of the device performs a method for controlling the course of a process.

14 Claims, 1 Drawing Sheet

(51) Int. Cl.
*G05B 19/418* (2006.01)
*G05B 23/02* (2006.01)

(52) U.S. Cl.
CPC ............ *G05B 2219/23197* (2013.01); *G05B 2219/24042* (2013.01); *G05B 2219/35475* (2013.01); *G05B 2219/37084* (2013.01); *G05B 2219/37242* (2013.01); *Y02P 90/22* (2015.11)

(56) References Cited

U.S. PATENT DOCUMENTS

| | | | | |
|---|---|---|---|---|
| 6,415,191 | B1 * | 7/2002 | Pryor | ........................ 700/95 |
| 6,449,526 | B1 * | 9/2002 | Sachs et al. | ................. 700/164 |
| 2007/0156279 | A1 * | 7/2007 | Dalley | ............... B29C 45/76 700/197 |
| 2008/0161959 | A1 | 7/2008 | Jerard et al. | |
| 2008/0161978 | A1 * | 7/2008 | Shah | ........................... 700/278 |

FOREIGN PATENT DOCUMENTS

| WO | WO 02/35304 | 5/2002 |
|---|---|---|
| WO | WO 2008/142386 | 11/2008 |

OTHER PUBLICATIONS

International Search Report, issued Jan. 18, 2012.

* cited by examiner

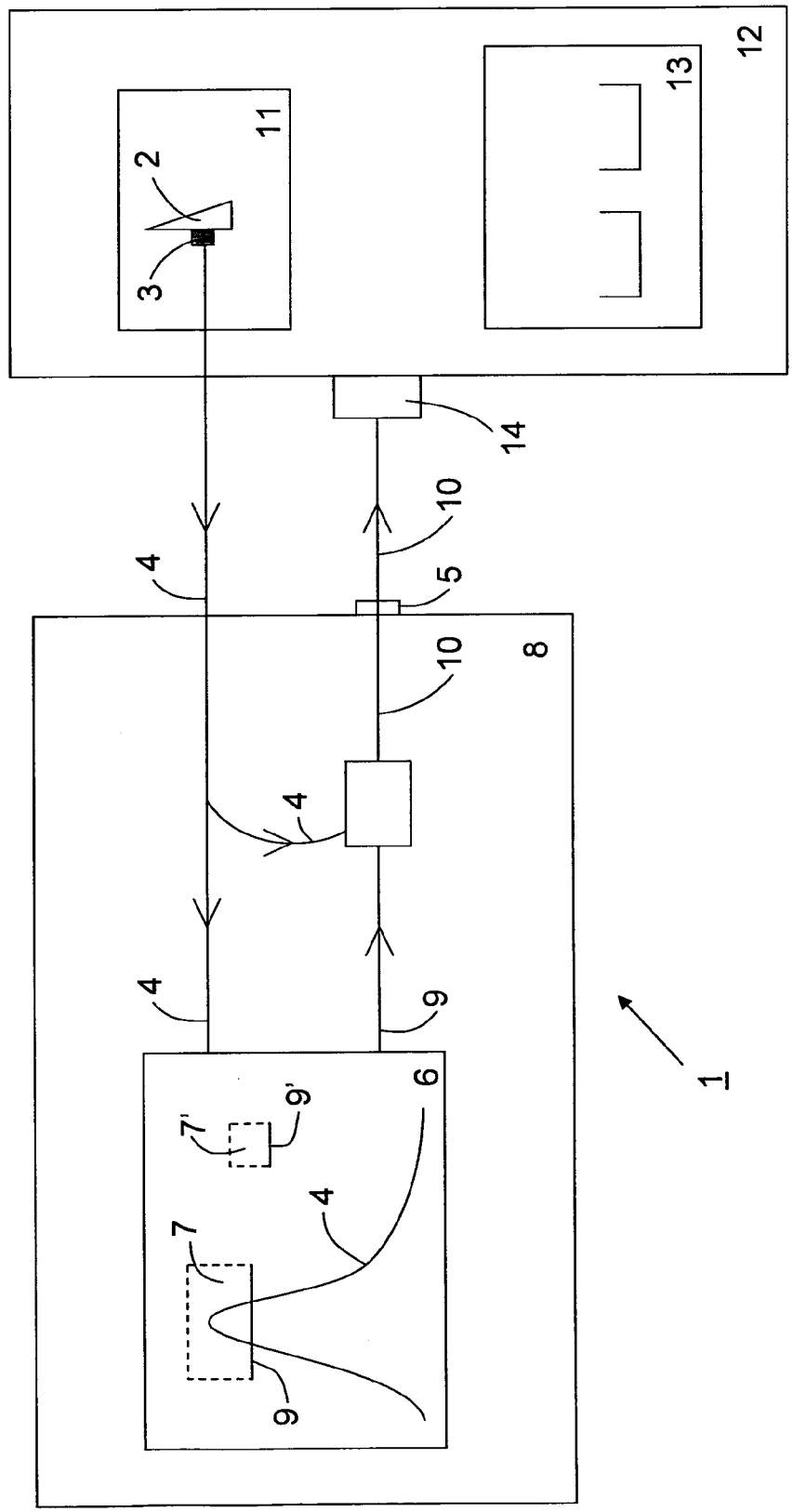

PROCESS CONTROL SYSTEM FOR PRODUCTION OF PARTS WITH GRAPHICAL INTERFACE

CROSS-REFERENCE TO RELATED APPLICATIONS

This application claims priority to International Application Serial No. PCT/CH2011/000164, filed Jul. 14, 2011, which claims priority to Swiss Application No. CH 1201/10 filed Jul. 21, 2010. International Application Serial No. PCT/CH2011/000164 is hereby incorporated herein for all purposes by this reference.

FIELD OF THE INVENTION

The invention relates to a device for controlling the course of a process in the production of parts in a tool, as well as a method for controlling the course of a process by means of such a device.

BACKGROUND

In the monitoring, control and regulation of production processes, such as for example injection moulding machines, machine tools, robot systems or suchlike, it is known to carry out the input of parameters for monitoring and control functions by means of digital inputs on a terminal or by the use of cursor keys via a display.

Thus, for example, the monitoring, the control and the regulation of injection moulding processes take place with the aid of the most diverse sensors. Thus, pressure, temperature, ultrasound or other sensors are known, which measure for example the pressure profile, the tool wall temperature, the melting temperature of a material to be processed in the course of the process or other variables in the course of the process. The measured data detected by the sensors are displayed graphically in curve profiles, which for example represent the corresponding process variable as a function of time, converted and evaluated. For this purpose, monitoring functions and real-time thresholds are for the most part used in injection moulding, especially for the process variables of tool internal temperature and tool wall temperature. A monitoring function calculates characteristic values from one or more curves, such as for example the maximum in a defined time window. These characteristic values are compared with preselected target parameters and, depending on whether the target parameters have been complied with or not, a defined action is triggered.

Examples of monitoring functions with injection moulding are "box entry-exit", "box no entry", "maximum", "minimum", "integral", "vertical threshold", "mean value", "envelope curve" etc.

A real-time threshold performs a defined action as soon as the established threshold is exceeded or fallen below. The actions set by real-time thresholds are for example "switch a digital output" or "trigger optical signalling on a display screen".

In the prior art, the monitoring functions and real-time thresholds are either digitally inputted or the limits are shifted in discrete steps by means of cursor keys in the form of hard keys or soft keys on a display screen, until they finally lie where the user wishes them to be. They can be displayed on the display screen in the curve view.

This kind of input or manipulation of monitoring functions and real-time thresholds, which are in each case also referred to as evaluation objects, is not very intuitive for the user and often requires special knowledge which not all users possess. It is therefore necessary to provide special training for personnel, which is time-consuming and expensive.

BRIEF SUMMARY OF THE INVENTION

The problem of the invention, therefore, is to specify a new kind of device and a new method for controlling the course of a process in the production of parts in a tool with or without subsequent reject separation, which no longer presents the drawbacks known from the prior art and, in particular, can also be operated easily, intuitively and flexibly without special knowledge.

The subject-matter of the invention solving these problems is characterised by the features of the independent claims. The dependent claims relate to particularly advantageous embodiments of the invention.

The invention thus relates to a device for controlling the course of a process in the production of parts in a tool with or without subsequent reject separation, comprising a sensor, which is fitted to the tool to detect measured values during the production process. In particular, a production process is also understood to mean an assembly process, a jointing process and any other process, until the part to be produced is finished and ready for delivery.

In addition, it comprises a data processing system, comprising a display for reading in and displaying the detected measured values. The device further comprises an output element, which is connected to the data processing system for the purpose of controlling the course of the process. Finally, a user can enter one or more target parameters into the data processing system. An output quantity can be ascertained in the data processing system on the basis of an analysis of these target parameters and the detected measured values, said output quantity being able to be transferred by means of the output element for the purpose of controlling the course of a process. According to the invention, the input of the target parameter or parameters is carried out by the user in an analogue manner.

Furthermore, the invention relates to a method for controlling the course of a process by means of such a device.

The advantages of this device and this method consist in the fact that a direct visual control of the input is always forced by means of an analogue input, since the analogue input is necessarily based on a visual input. Typing errors, such as are common with alphanumeric inputs, are no longer possible. In addition, the input is quicker and does not require any special prior knowledge on the part of the user.

BRIEF DESCRIPTION OF THE DRAWINGS

The invention is explained below with the aid of the drawing. It shows in a diagrammatic representation:

FIG. 1. a device according to the invention in the operational state.

DESCRIPTION OF EXEMPLARY EMBODIMENTS OF THE INVENTION

FIG. 1 shows, in a diagrammatic representation, an example of embodiment of a device 1 according to the invention in the operational state. Device 1 is used to control the course of a process in a production device 12, which comprises reject separation 13. Production device 12 comprises a tool 11, in which a part 2 is produced. It is preferably an injection moulding machine, a machine tool or a robot system.

In particular, consideration is given here to cyclical process sequences, which are to be controlled by the device according to the invention and by the method according to the invention.

Device 1 according to the invention comprises a sensor 3 for detecting measured values 4 and an output element 5 for controlling the course of a process in production device 12 or in reject separation 13. In addition, device 1 comprises a data processing system 8 with a display 6.

Output element 5 can in particular be an interface for the data output, at which for example a connection line can be provided to production device 12, to reject separation 13 or to a central control 14 for the production and/or the reject separation.

Sensor 3 is fitted in tool 11 for detecting measured values 4 during the production process. For many applications, it is located adjacent to or very close to part 2 to be produced. As a rule, it measures the time-dependent course of, for example, a pressure or a temperature. Measured values 4 are conveyed in connections provided for the purpose into data processing system 8 and displayed on display 6 in the form of a curve 4.

Target parameters 9 have to be inputted into data processing system 8, on the basis of which an output quantity 10 can be ascertained in an analysis together with detected measured values 4. This output quantity 10 can for example contain information as to whether a produced part is a good part or a reject part. On the other hand, it is possible to ascertain on the basis of the analysis a time at which a production step should be started or ended in the production process. The desired information in each case is obtained in output quantity 10. This output quantity 10 is finally relayed via output element 5 for the purpose of controlling the course of the process at production device 12, if need be at reject separation 13 or at a control 14. A process is then duly controlled according to output quantity 10. For example, parts are accordingly sorted into good parts and rejects.

According to the invention, provision is made such that target parameters 9 can be read in by the user in an analogue manner. The user does not therefore input any digital values, nor does he use any buttons which shift preselected target values in small steps until the desired position. The user can establish his desired target values 9 directly by means of analogue movements on display 6.

He has various possible ways of doing this. On the one hand, this can be carried out for example by means of a computer mouse, whereby he defines, for example, a rectangle with the cursor by drawing a diagonal from one corner point to another corner point. He can achieve the same thing on a touch screen, when display 6 is designed as such. There, he draws the diagonal using a finger or with a pen.

It is also possible to provide on display 6 one or more graphic evaluation objects 7', which represent one or more of provided target values 9'. In the present example, evaluation object 7' is defined by a set of several target parameters 9', which establish a rectangular area between two points in time and a minimum and a maximum target value. Evaluation object 7' thus defines, in the example represented here, an area on display 6 in which the maximum of measurement curve 4 must lie in order that part 2 produced in production device 12 meets the quality requirements and is not therefore a reject.

In the apparatus, evaluation object 7' is positioned by an operator on communication surface 6 at a preselected location, in which the maximum of measurement curve 4 should lie. For this purpose, the user shifts evaluation object 7' on the display and changes its size until evaluation object 7 on display 6 is at the desired location and in the desired size. According to the invention, this input is made by the user in an analogue manner. The input can be conveniently made by "drag and drop", since the rectangles or lines can easily be defined and shifted to the desired location.

The user establishes target parameters 9 through the position of the evaluation object on display 6. For example, he can define a larger or smaller time range in which the maximum of pressure variation curve 4 may lie. A different maximum or minimum value of the permissible pressure can also be defined. Another example is a vertical line, which can for example define a time at which a new process should be started, for example a change-over from the injection phase to the after-pressure phase in injection moulding, one of the critical control parameters in injection moulding.

Since earlier measured values or measured curves 4 are shown on display 6, it is easy for the user to input target parameters 9. If for example a group of curves of measured values 4 during previously measured process cycles is displayed, and the latter all led to good parts, the user is thus able, on the basis of the characteristic common features of these data or curves 4, to define process-relevant target parameters 9 and to match the latter directly with displayed earlier measured values 4. Output quantity 10 is finally ascertained in the analysis on the basis of these target parameters 9 and subsequently detected measured values 4 and is conveyed to output element 5, as represented in FIG. 1.

In this way, measured values 4, i.e. for example a pressure variation curve 4, are brought into a graphic relationship with evaluation curve 7, so that an output quantity 10 can be ascertained from an analysis of measured values 4 and target parameters 9, said output quantity being able to be read out via output element 5 for the purpose of controlling the course of a process. This output quantity can for example contain "reject part" information if measurement curve 4 does not have a maximum in target parameter area 9.

A further example of an application is the determination of the change-over point in injection moulding. With available measurement curves 4 of, for example, pressure curves which have all led to good parts, the user is thus easily able to establish when, i.e. in the presence of what condition, the after-pressure phase should start.

In practice, it is often the case that a plurality of evaluation objects 7 are provided on communication surface 6 which can test different desired curve properties or can also define differently shaped areas in which preselected regions of a measurement curve 4 should lie. Thus, provided evaluation objects 7' can also have, for example, round or oval, triangular, geometrically irregular shapes or any other desired shape, depending on the corresponding technical requirements on the tests of the curved shapes. They can also be simple straight lines, arrows or dots, which defined certain threshold values.

It goes without saying that measured values 4 can be not only pressure variations or temperature variations, but also in principle any suitable quantity which suitably depicts a desired property of the course of a process.

The use of a device 1 according to the invention or a method according to the invention is of course not limited to the elimination of rejects. Thus, it is for example also possible for a specific process quantity to be controlled or regulated by constant monitoring.

In contrast with many applications from the prior art, however, it is under no circumstances intended to achieve a control which is intended to track the course of a curve, for example a heating curve. In the present case, especially in the case of controlling a reject sorting system, it is a matter of evaluation criteria which are either satisfied or not on a curve. The production process is not checked and controlled, especially not during the recording of the curve, as is the case with the tracking of target curves. Here, at the end of the production process, when a measurement curve 4 has been completely ascertained, this curve 4 is evaluated and finished part 2 sorted accordingly.

In particular, a set target criterion 9 can be represented by an area 7 with a plurality of boundary lines adjacent to one another. It is possible to establish the boundary lines through which measurement curve 4 must enter into or exit from area 7 in order to satisfy the target criteria of target parameters 9. On the other hand, negative criteria can be inputted, whereby it can be decided that measurement curve 4 must not cross a specific boundary line or must not enter into and/or exit from area 7 through this line. In FIG. 1, it would for example be inputted that measurement curve 4 must enter into field 7 through the lower fixed line and exit from the latter again there, but must not cross the other dashed lines in any direction. A higher maximum of curve 4, which would lie outside area 7, will not therefore meet target parameters 9, since the upper dashed line would be crossed twice. A premature maximum would also not comply with target parameters 9, which may well lie in field 7, but for which the left-hand dashed side of area 7 would be crossed by measurement curve 4 upon entry into area 7.

The fields or lines can easily be set in an analogue manner intuitively on the basis of existing measurement curves 4 of previous measurements, especially when groups of curves 4 of good parts are available which have a certain tolerable scatter.

LIST OF REFERENCE NUMBERS 1 device
2 part
3 sensor
4 measured values
5 output element
6 display
7, 7' evaluation object
8 data processing system
9, 9' target parameter
10 output quantity
11 tool
12 production device
13 reject separation
14 control

The invention claimed is:

1. A device for controlling the course of a cyclic process in the production of parts in a tool in a production device with or without subsequent reject separation, comprising:
a sensor, which is fitted to the tool for detecting measured values during the production process,
a data processing system comprising a display for reading in and displaying the detected measured values and
an output element which is connected to the data processing system, wherein during the course of the production process a user can enter into the data processing system one or more target process parameters that are presented on the display in a quantitative graphical relationship simultaneously with the detected measured values, wherein the user can enter the target process parameters into the data processing system on the basis of previous measured values of the cyclical process, wherein at least one evaluation element is provided as a target parameter in a graphic form on the display, which graphic form can be shifted and changed in its size by the input on the display by the user, wherein the previously measured values include a line acquired during the complete formation of an acceptable part in at least one previous process cycle, the measured values represented by at least a position and size of the line, the target process parameters represented by at least a position and size of at least one line, wherein the target process parameters pertain to parameters of the production process rather than parameters of the parts produced by the process, and an output quantity can be ascertained by the data processing system on the basis of a quantitative analysis of the target process parameters and the detected measured values, said output quantity being able to be transferred by means of the output element to the production device for the purpose of controlling the course of the process, wherein at least one of the target process parameters can be entered by the user with the display in an analogue manner, and wherein the analogue manner by which the user enters the at least one target process parameter into the data processing system by employing a "drag and drop" operation of an input device of the data processing system.

2. The device according to claim 1, wherein the display is a touch screen, on which the at least one target process parameter can be read in an analogue manner by touching the surface.

3. The device according to claim 1, wherein the at least one target process parameter can be read in in an analogue manner by moving a computer mouse.

4. The device according to claim 1, wherein the measured values are pressure variations or temperature variations.

5. The device according to claim 1, wherein the production device is an injection molding machine or a machine tool or a robot system.

6. The device according to claim 1, wherein the course of the process to be controlled is a reject separation.

7. A method for controlling the course of a cyclic process in the production of parts in a tool in a production device with or without subsequent reject separation by means of a device, which comprises a sensor, which is fitted to the tool and is connected to a data processing system with a display, wherein the data processing system is in turn connected to an output element, the method comprising the following steps:
one or more target process parameters are entered in an analogue manner by a user in a quantitative graphical manner into the data processing system during the course of the production process, wherein the analogue manner by which the user enters the at least one target process parameter into the data processing system is a "drag and drop" operation of an input device of the data processing system, wherein the user can enter the target process parameters into the data processing system on the basis of previous measured values of the cyclical process,
measured values are detected during the production process by the sensor, and the measured values are read into the data processing system and displayed on the display,
the measured values are displayed on the display simultaneously with the target process parameters, wherein the measured values include a line acquired during at least one complete previous process cycle, and the measured values are represented by at least a position and size of the line,
providing at least one evaluation element as a target parameter in a graphic form on the display, which graphic form can be shifted and changed in its size by the input on the display by the user, and the target process parameters are represented by at least a position and size of at least one line, and wherein an output quantity is ascertained in the data processing system on the basis of an analysis of the target process parameters and the detected measured values, said output quantity being transferred by means of the output element for the purpose of controlling the course of the process.

8. The method according to claim 7, wherein the user uses a computer mouse for the analogue input of the target parameters.

9. The method according to claim 7, wherein the user uses a touch screen by touching the surface of the display for the analogue input of the target parameters.

10. The method according to claim 7, wherein the course of the process to be controlled is a reject separation.

11. The method according to claim 7, wherein the sensor detects a pressure or pressure variations or a temperature or temperature variations.

12. The method according to claim 7, wherein the parts are produced in a tool of an injection molding machine, a machine tool or a robot system.

13. The method according to claim 7, wherein the analysis ascertains the output quantity on the basis of these target parameters and the subsequently detected measured values.

14. The device according to claim 1, wherein an evaluation element is provided as a target parameter in a graphic form on the display and superimposed over a portion of the display containing the detected measured values.

\* \* \* \* \*